United States Patent
Chen et al.

(10) Patent No.: US 11,735,931 B2
(45) Date of Patent: Aug. 22, 2023

(54) BATTERY MODULE CAPABLE OF ADJUSTING RESISTANCE

(71) Applicant: Acer Incorporated, New Taipei (TW)

(72) Inventors: Shang-Hui Chen, New Taipei (TW); Chih-Kai Wang, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 63 days.

(21) Appl. No.: 17/159,448

(22) Filed: Jan. 27, 2021

(65) Prior Publication Data
US 2021/0399556 A1   Dec. 23, 2021

(30) Foreign Application Priority Data
Jun. 22, 2020  (TW) .................................. 109121118

(51) Int. Cl.
*H02J 7/00*       (2006.01)
*G01R 31/36*      (2020.01)
*H01M 10/48*      (2006.01)

(52) U.S. Cl.
CPC ............ *H02J 7/0024* (2013.01); *G01R 31/36* (2013.01); *H01M 10/482* (2013.01); *H02J 7/0031* (2013.01)

(58) Field of Classification Search
CPC .................................................... H02J 7/0024
USPC ........................................................... 320/117
See application file for complete search history.

(56) References Cited

U.S. PATENT DOCUMENTS

| | | | |
|---|---|---|---|
| 8,253,383 B2* | 8/2012 | Li .................. | G01R 31/396 320/134 |
| 8,581,556 B2* | 11/2013 | Shibata ............ | H01M 10/46 320/134 |
| 11,424,502 B2 | 8/2022 | Seol et al. | |
| 2012/0194199 A1 | 8/2012 | Mizoguchi | |
| 2016/0028257 A1* | 1/2016 | Hashimoto ....... | H01M 10/441 320/112 |
| 2016/0036250 A1* | 2/2016 | Cho .................. | H02J 7/0048 320/112 |

(Continued)

FOREIGN PATENT DOCUMENTS

| | | |
|---|---|---|
| CN | 1592028 A | 3/2005 |
| CN | 102570513 A | 7/2012 |

(Continued)

OTHER PUBLICATIONS

Chinese language office action dated Apr. 25, 2023, issued in application No. CN 202110179484.0.

*Primary Examiner* — Yalkew Fantu
(74) *Attorney, Agent, or Firm* — McClure, Qualey & Rodack, LLP

(57) ABSTRACT

A battery module including a battery string and a switch is provided. The battery string includes a first battery, a second battery, a third battery, a first metal plate, and a second metal plate. The first battery includes a first positive terminal and a first negative terminal. The second battery includes a second positive terminal and a second negative terminal. The third battery includes a third positive terminal and a third negative terminal. The first metal plate is connected to the first negative terminal and the second positive terminal. The second metal plate is connected to the second negative terminal and the third positive terminal. The switch is connected to the first or second metal plate.

9 Claims, 7 Drawing Sheets

(56) References Cited

U.S. PATENT DOCUMENTS

| | | | |
|---|---|---|---|
| 2018/0233785 A1 | 8/2018 | Na et al. | |
| 2019/0237713 A1* | 8/2019 | Seol | H01M 50/502 |
| 2019/0326746 A1* | 10/2019 | Li | G01R 31/364 |
| 2020/0144572 A1* | 5/2020 | Lee | H01M 10/653 |
| 2020/0185793 A1* | 6/2020 | Itaya | G01R 31/364 |

FOREIGN PATENT DOCUMENTS

| | | |
|---|---|---|
| CN | 104092266 A | 10/2014 |
| CN | 205565813 U | 9/2016 |
| CN | 107134757 A | 9/2017 |
| CN | 110112336 A | 8/2019 |

* cited by examiner

BATTERY MODULE CAPABLE OF ADJUSTING RESISTANCE

CROSS REFERENCE TO RELATED APPLICATIONS

This application claims priority of Taiwan Patent Application No. 109121118, filed on Jun. 22, 2020, the entirety of which is incorporated by reference herein.

BACKGROUND OF THE INVENTION

Field of the Invention

The invention relates to a battery module, and more particularly to a battery module that is capable of changing the equivalent impedances of the metal plates between batteries.

Description of the Related Art

In conventional battery modules, each battery module comprises a plurality of batteries connected in series. When the battery module discharges, a low-power protection function is started. For example, when the voltage of a battery in the battery module is lower than 2.75V, it means that the battery module is over-discharged. To avoid the battery aging, when the voltage of a battery in the battery module is lower than a threshold, a low-power protection function is started to stop the discharging operation of the battery module. However, when the connection impedance between batteries is large, a battery in the battery module may discharge excessively. Therefore, the low-power protection function is incorrectly started so that the battery module stops providing power.

BRIEF SUMMARY OF THE INVENTION

In accordance with an embodiment of the disclosure, a battery module comprises a first battery string and a first switch. The first battery string comprises a first battery, a second battery, a third battery, a first metal plate, and a second metal plate. The first battery comprises a first positive terminal and a first negative terminal. The second battery comprises a second positive terminal and a second negative terminal. The third battery comprises a third positive terminal and a third negative terminal. The first metal plate is connected to the first negative terminal and the second positive terminal. The second metal plate is connected to the second negative terminal and the third positive terminal. The first switch comprises a first input terminal and a first output terminal. The first input terminal and the second output terminal are connected to one of the first metal plate and the second metal plate.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
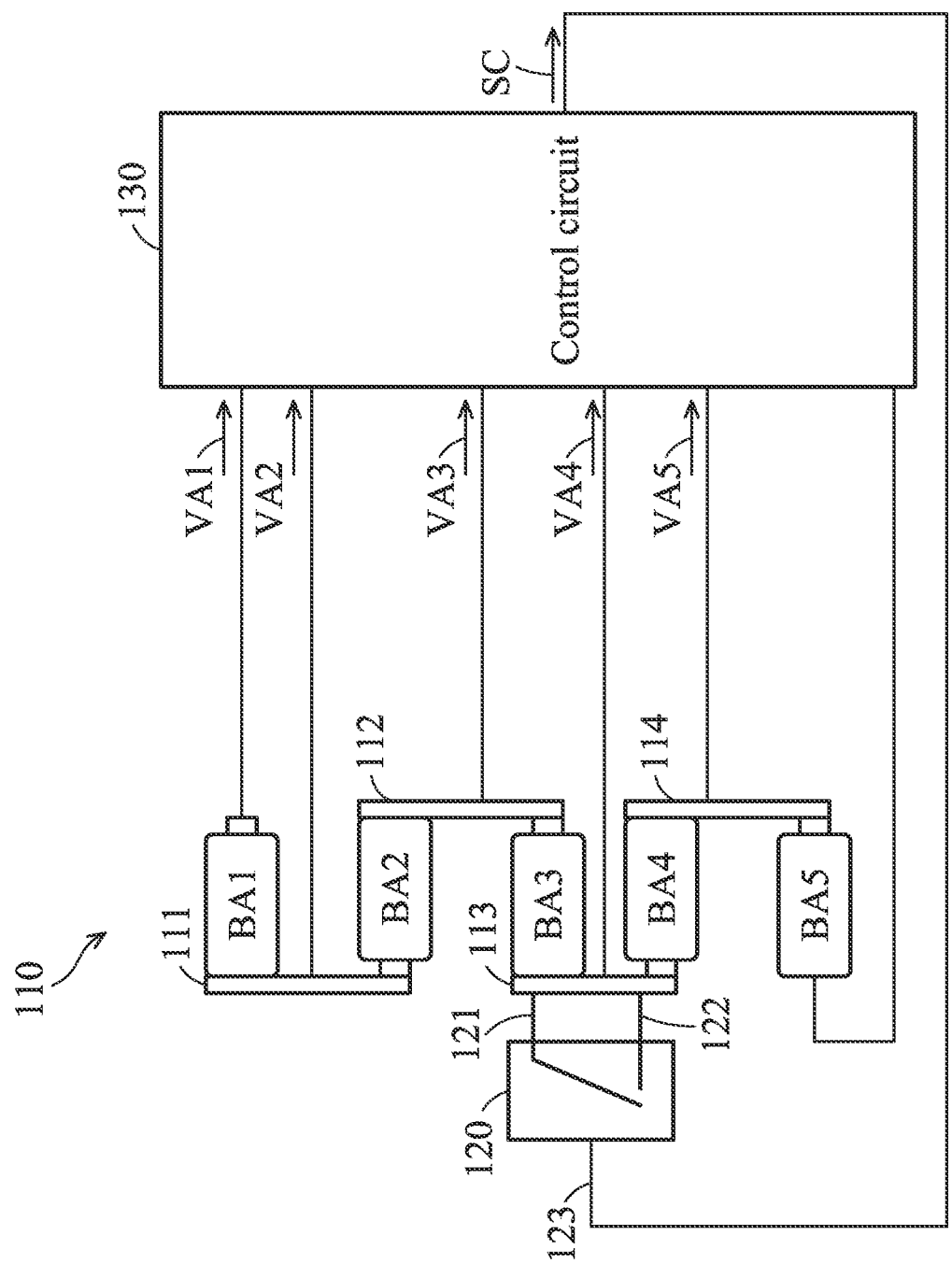
FIG. 1 is a schematic diagram of an exemplary embodiment of a battery module according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a battery module according to various aspects of the present disclosure. As shown in FIG. 1, the battery module 100 comprises a battery string 110 and a switch 120. In one embodiment, the battery module 100 is a vehicle battery module, but the disclosure is not limited thereto. In this embodiment, the battery string 110 comprises batteries BA1~BA5 and metal plates 111~114.

The batteries BA1~BA5 are secondary batteries. In one embodiment, each of batteries BA1~BA5 is a lithium battery, but the disclosure is not limited thereto. The kind of batteries BA1~BA5 is not limited in the present disclosure. Any battery can serve as one of the batteries BA1~BA5, as long as the battery is capable of storing energy. The number of batteries is not limited in the present disclosure. In other embodiments, the battery string 110 comprises more or fewer batteries.

The metal plates 111~114 are coupled between the negative terminal of a battery and the positive terminal of another battery. For example, the metal plate 111 is connected to the negative terminal of the battery BA1 and the positive terminal of the battery BA2. The metal plate 112 is connected to the negative terminal of the battery BA2 and the positive terminal of the battery BA3. The metal plate 113 is connected to the negative terminal of the battery BA3 and the positive terminal of the battery BA4. The metal plate 114 is connected to the negative terminal of the battery BA4 and the positive terminal of the battery BA5.

The materials of metal plates 111~114 are not limited in the present disclosure. In one embodiment, the materials of metal plates 111~114 are Ni. Additionally, the shapes of metal plates 111~114 are not limited in the present disclosure. In this embodiment, the shapes of metal plates 111~114 are strip shapes. In other embodiments, the shape of one of the metal plates 111~114 may be different from the shape of another of the metal plates 111~114.

In some embodiments, the sizes of metal plates 111~114 are limited by the size of the battery module 100. The sizes of metal plates 111~114 are also limited by the arrangements of batteries BA1~BA5. Therefore, the size of one of the metal plates 111~114 may be smaller than the size of another of the metal plates 111~114. For example, in FIG. 1, the size of the metal plate 113 is smaller than the size of each of the metal plates 111, 112, and 114. In particular, the size of the metal plate means the volume of the metal plate. Taking the metal plate 111 as an example, since the shape of the metal plate 111 is a strip shape, the size of the metal plate 111 is a product of its length, width and height.

The switch 120 comprises an input terminal 121 and an output terminal 122. In this embodiment, since the size of the metal plate 113 is smaller than the size of each of the metal plates 111, 112, and 114, the switch 120 is connected to the metal plate 113. As shown in FIG. 1, the input terminal 121 and the output terminal 122 of the switch 120 are connected to the metal plate 113. When the switch 120 is turned on, the input terminal 121 is electrically connected to the output terminal 122. Since the turned-on path is added in the metal plate 113, it can be regarded as the size of the metal plate 113 has increased. Therefore, the equivalent impedance of the metal plate 113 has decreased so that the conductivity of the metal plate 113 is increased. Even if the size of the metal plate 113 is smaller than the size of each of the metal plates 111, 112 and 114, the conductivity of the metal plate 113 is similar to the conductivity of each of the metal plates 111, 112, and 114 due to the setting of the switch 120.

In some embodiments, the switch 120 further comprises a control terminal 123. The control terminal 123 is configured to receive a control signal SC. When the control signal SC is enabled, the switch 120 is turned on. Therefore, the input terminal 121 is electrically connected to the output terminal 122. When the control signal SC is not enabled, the switch 120 is not turned on. Therefore, the input terminal 121 is not electrically connected to the output terminal 122. In one embodiment, the control signal SC is generated by a control circuit 130. In this case, the control circuit 130 detects the voltages VA1~VA5 of the batteries BA1~BA5 and determines whether to enable the control signal SC according to the voltages VA1~VA5.

For example, when the voltage VA4 of battery BA4 is the lowest among voltages VA1~VA5 of batteries BA1~BA5 and the voltage difference between the voltage VA4 and the highest among voltages VA1~VA5 of batteries BA1~BA5 exceeds a threshold value, it means that the voltage VA4 of battery BA4 is too low. Therefore, the control circuit 130 enables the control signal SC. The switch 120 is turned on so that the conductivity of the metal plate 113 is increased, which reduces the drop speed of the voltage VA4 of the battery BA4. In some embodiments, when the switch 120 is turned on, the voltage VA4 of the battery BA4 may increase slightly.

Figure 2:
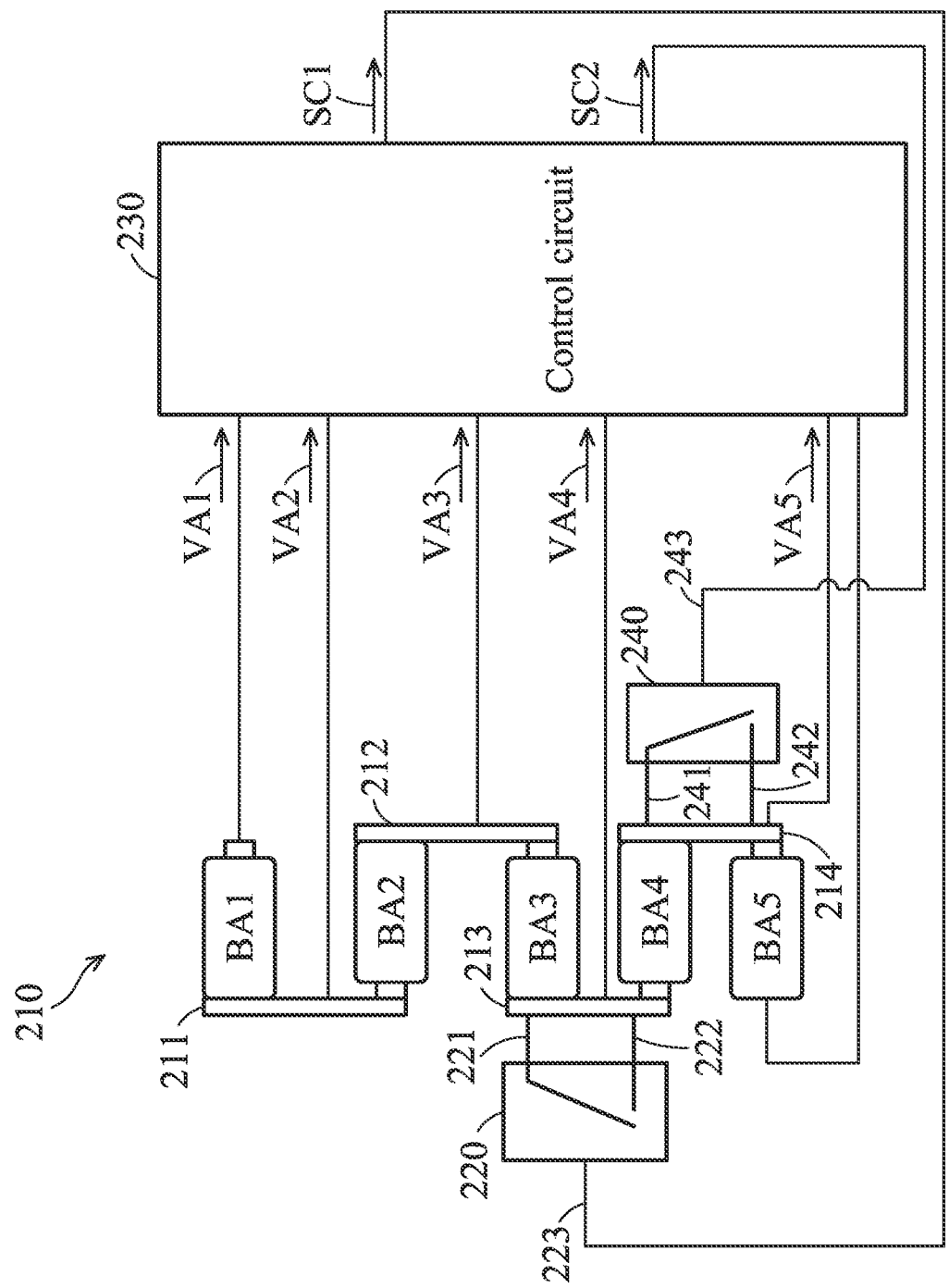
FIG. 2 is a schematic diagram of another exemplary embodiment of the battery module according to various aspects of the present disclosure.

FIG. 2 is a schematic diagram of another exemplary embodiment of the battery module according to various aspects of the present disclosure. As shown in FIG. 2, the battery module 200 comprises a battery string 210, switches 220 and 240. The battery string 21 comprises batteries BA1~BA5 and metal plates 211214. The metal plate 211 is connected to the negative terminal of the battery BA1 and the positive terminal of the battery BA2. The metal plate 212 is connected to the negative terminal of the battery BA2 and the positive terminal of the battery BA3. The metal plate 213 is connected to the negative terminal of the battery BA3 and the positive terminal of the battery BA4. The metal plate 214 is connected to the negative terminal of the battery BA4 and the positive terminal of the battery BA5. In this embodiment, since the size of each of the metal plates 213 and 214 is smaller than the size of each of the metal plates 211 and 212, the switch 220 is connected to the metal plate 213 and the switch 240 is connected to the metal plate 214.

As shown in FIG. 2, the input terminal 221 and the output terminal 222 of the switch 220 are connected to the metal plate 213. When the switch 220 is turned on, the input terminal 221 is electrically connected to the output terminal 222. Since a turned-on path is added in the metal plate 213, the equivalent impedance of the metal plate 213 has decreased so that the conductivity of the metal plate 213 is increased. Furthermore, the input terminal 241 and the output terminal 242 of the switch 240 are connected to the metal plate 214. When the switch 240 is turned on, the input terminal 241 is electrically connected to the output terminal 242 to reduce the equivalent impedance of the metal plate 214 and increase the conductivity of the metal plate 214.

In some embodiments, the switch 220 further comprises a control terminal 223 to receive a control signal SC1. In this case, when the control signal SC1 is enabled (e.g., the control signal SC1 is at a high level or a low level), the switch 220 is turned on. When the control signal SC1 is not enable (e.g., the control signal SC1 is at a low level or a high level), the switch 220 is not turned on. Therefore, the input terminal 221 is not electrically connected to the output terminal 222. In addition, the switch 240 further comprises a control terminal 243 to receive a control signal SC2. Since the feature of the switch 240 is the same as the feature of the switch 220, the description of the switch 240 is omitted.

In one embodiment, the battery module 200 further comprises a control circuit 230. The control circuit 230 enables at least one of control signals SC1 and SC2 according to voltages VA1~VA5 of batteries BA1~BA5 to turn on at least one of switches 220 and 240.

Even if the size of the metal plate 113 is smaller than the size of each of the metal plates 111, 112 and 114, the conductivity of the metal plate 113 is similar to the conductivity of each of the metal plates 111, 112, and 114 due to the setting of the switch 120. The following table shows the changes of the voltages VA1~VA5 of the batteries BA1~BA5.

| Time | VA1 | VA2 | VA3 | VA4 | VA5 | Voltage difference between the maximum voltage and the minimum voltage among VA1~VA5 |
|---|---|---|---|---|---|---|
| T1 | 3.998 V | 3.997 V | 3.995 V | 3.996 V | 4.000 V | 0.005 V |
| T2 | 3.764 V | 3.750 V | 3.652 V | 3.797 V | 3.755 V | 0.145 V |
| T3 | 2.998 V | 2.993 V | 2.743 V | 3.105 V | 3.006 V | 0.362 V |

Assume that the control circuit 230 measures the voltages VA1~VA5 of the batteries BA1~BA5 from time T1 to time T3. At time T1, voltage VA5 of battery BA5 is the maximum voltage and voltage VA3 of battery BA3 is the minimum voltage. At this time, the voltage difference between the maximum voltage and the minimum voltage is about 0.005V. At time T2, voltage VA4 of battery BA4 is the maximum voltage and voltage VA3 of battery BA3 is the minimum voltage. At this time, the voltage difference between the maximum voltage and the minimum voltage is about 0.145V. At time T3, voltage VA4 of battery BA4 is the maximum voltage and voltage VA3 of battery BA3 is the minimum voltage. At this time, the voltage difference between the maximum voltage and the minimum voltage is about 0.362V.

In this case, the control circuit 230 compares each voltage difference with a threshold value. Assume that the threshold value is 0.3V. At time T1, since the voltage difference (0.005V) does not exceed the threshold value, the control circuit 230 does not turn on the switches 220 and 240. At time T2, since the voltage difference (0.145V) does not exceed the threshold value, the control circuit 230 does not turn on the switches 220 and 240. However, at time T3, since the voltage difference (0.362V) exceeds the threshold value, the control circuit 230 turns on at least one of switches 220 and 240. In one embodiment, since voltage VA3 of battery BA3 is the minimum voltage, the control circuit 230 turns on the switch 220. The switch 220 is connected to the metal plate 213 which connects to the positive terminal of battery BA3.

Figure 3:
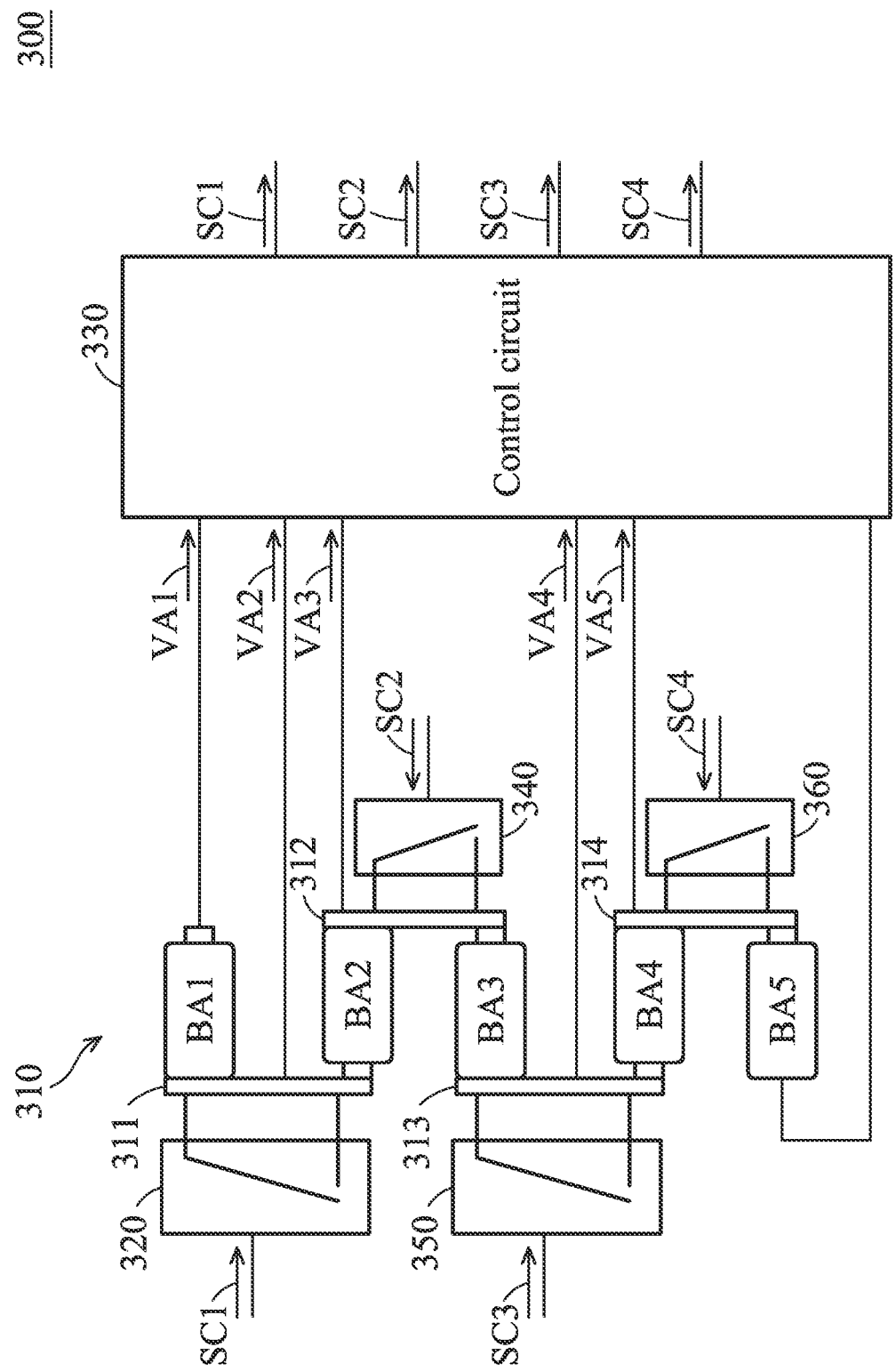
FIG. 3 is a schematic diagram of another exemplary embodiment of the battery module according to various aspects of the present disclosure.

FIG. 3 is a schematic diagram of another exemplary embodiment of the battery module according to various aspects of the present disclosure. The battery module 300 comprises a battery string 310 and switches 320, 340, 350, and 360. Since the structure of the battery string 310 is the same as the structure of the battery string 110 of FIG. 1, the description of the battery string 310 is omitted. In this embodiment, each metal plate is connected to a switch. In this case, since it is impossible to predict in advance which metal plate is smaller in size, a switch is disposed in one metal plate. As shown in FIG. 3, the metal plate 311 is connected to the switch 320, the metal plate 312 is connected to the switch 340, the metal plate 313 is connected to the switch 350, and the metal plate 314 is connected to the switch 360. Since the feature of each of the switches 320, 340, 350, and 360 is the same as the switch 120 of FIG. 1, the descriptions of the switches 320, 340, 350, and 360 are omitted.

In some embodiments, the battery module 300 further comprises a control circuit 330. The control circuit 330 generates control signals SC1~SC4 according to the voltages VA1~VA5 of the batteries BA1~BA5. In such cases, the control circuit 330 first calculates the voltage difference between the maximum voltage and the minimum voltage of voltages VA1~VA5 and determines whether the voltage difference exceeds the threshold value. When the voltage difference does not exceed the threshold value, the control circuit 330 does not enable the control signals SC1~SC4. At this time, the switches 320, 340, 350, and 360 are not turned on. However, when the voltage difference exceeds the threshold, the control circuit 330 enables the corresponding control signal according to the battery that has the minimum voltage. Therefore, the corresponding switch is turned on.

For example, if voltage VA5 is the minimum voltage and the voltage difference between the voltage VA5 and the highest among voltages VA1~VA4 exceeds the threshold value, the control circuit 330 enables the control signal SC4 to turn on the switch 360 that is connected to the positive terminal of the battery BA5. Since the conductivity of the metal plate 340 is increased, the dropping speed of the voltage VA5 is reduced. In some embodiments, when the switch 360 is turned on, the voltage VA5 increases slightly. At this time, the control circuit 330 does not enable the control signals SC1~SC3. Therefore, the switches 320, 340, 350, and 360 are not turned on.

Figure 4A:
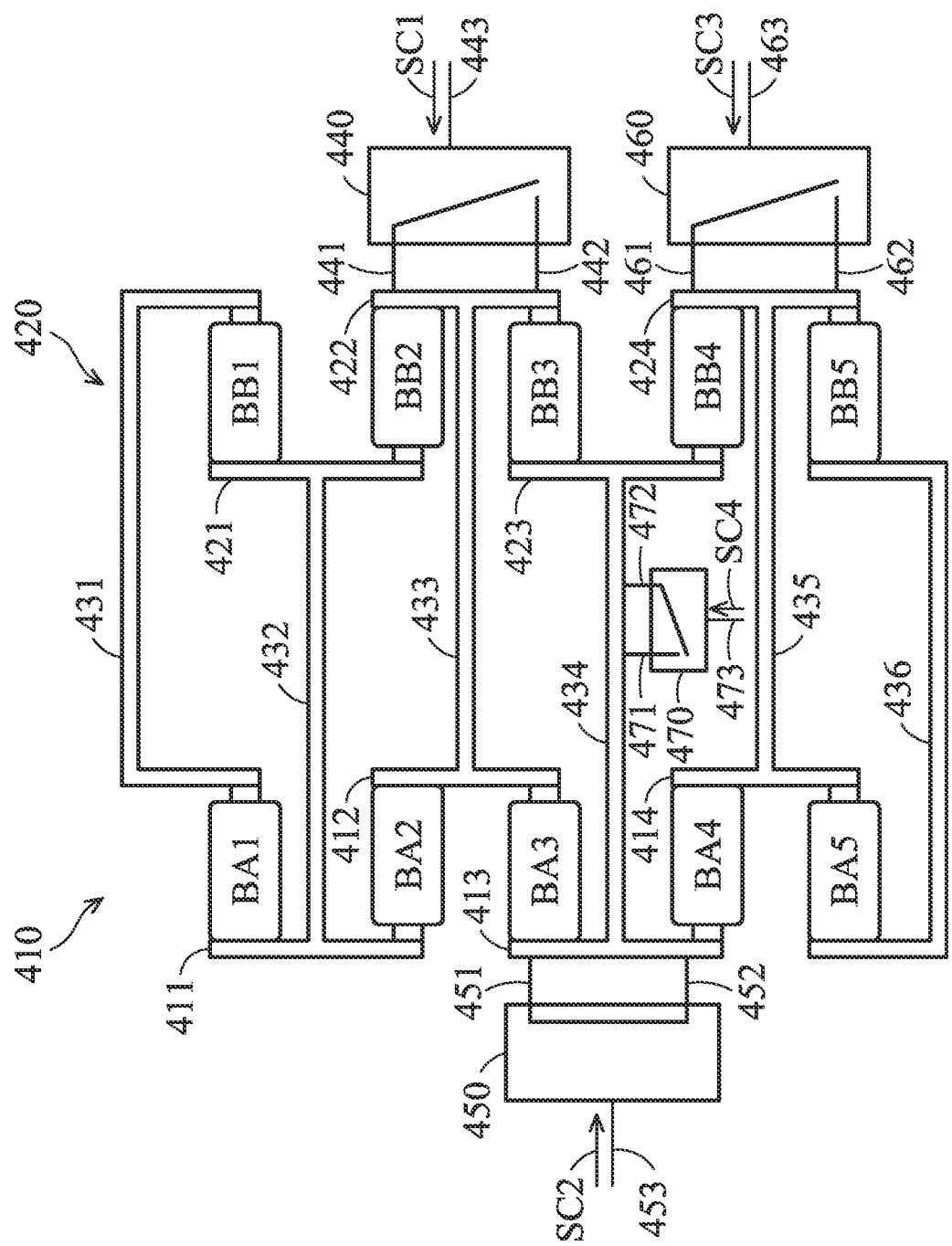
FIG. 4A is a schematic diagram of another exemplary embodiment of the battery module according to various aspects of the present disclosure.

FIG. 4A is a schematic diagram of another exemplary embodiment of the battery module according to various aspects of the present disclosure. As shown in FIG. 4A, the battery string 410 comprises batteries BA1~BA5 and metal plates 411~414. The metal plate 411 is connected to the negative terminal of the battery BA1 and the positive terminal of the battery BA2. The metal plate 412 is connected to the negative terminal of the battery BA2 and the positive terminal of the battery BA3. The metal plate 413 is connected to the negative terminal of the battery BA3 and the positive terminal of the battery BA4. The metal plate 414 is connected to the negative terminal of the battery BA4 and the positive terminal of the battery BA5. In this embodiment, the input terminal 451 and the output terminal 452 of the switch 450 are connected to the metal plate 413, and the control terminal 453 of the switch 450 receives the control signal SC2. In this case, since the control signal SC2 is enabled, the input terminal 451 is electrically connected to the output terminal 452.

The battery string 420 comprises batteries BB1~BB5 and metal plates 421~424. The metal plate 421 is connected to the negative terminal of the battery BB1 and the positive terminal of the battery BB2. The metal plate 422 is connected to the negative terminal of the battery BB2 and the positive terminal of the battery BB3. The metal plate 423 is connected to the negative terminal of the battery BB3 and the positive terminal of the battery BB4. The metal plate 424 is connected to the negative terminal of the battery BB4 and the positive terminal of the battery BB5. In this embodiment, the input terminal 441 and the output terminal 442 of the switch 440 are connected to the metal plate 422 and the input terminal 461 and the output terminal 462 of the switch 460 are connected to the metal plate 424. In this case, since the control signals SC1 and SC3 are not enabled, the switches 440 and 460 are turned off. Therefore, the input terminal 441 of the switch 440 does not electrically connect to the output terminal 442. Similarly, the input terminal 461 of the switch 460 is not electrically connected to the output terminal 462.

In this embodiment, the metal plate 432 is connected to the positive terminals of the batteries BB1 and BA1. The metal plate 432 is also connected to the metal plates 411 and 421. The metal plate 433 is connected to the metal plates 412 and 422. The metal plate 434 is connected to the metal plates 413 and 423. The metal plate 435 is connected to the metal plates 414 and 424. The metal plate 436 is connected to the negative terminals of the batteries BA5 and BB5. In this case, the switch 470 is connected to the metal plate 434. The input terminal 471 and the output terminal 472 of the switch 470 is connected to the metal plate 434. The control terminal 473 of the switch 470 receives the control signal SC4. Since the control signal SC4 is not asserted, the input terminal 471 of the switch 470 is not electrically connected to the output terminal 472. The number of switches is not limited in the present disclosure. In one embodiment, each metal plate is coupled to a switch.

The control signals SC1~SC4 are provided by a control circuit (not shown). In this case, the control circuit detects the voltages of the batteries BA1~BA5 and BB1~BB5 and determines whether to enable at least one of control signals SC1~SC4 according to the detection results. For example, when the voltage of battery BA4 is the minimum voltage, the control circuit may enable the control signal SC2 to turn on the switch 450. Therefore, the switch 450 operates in a closed state. In this case, the control circuit does not enable the control signals SC1, SC3, and SC4. Therefore, the switches 440, 460 and 470 operate in an open state.

Figure 4B:
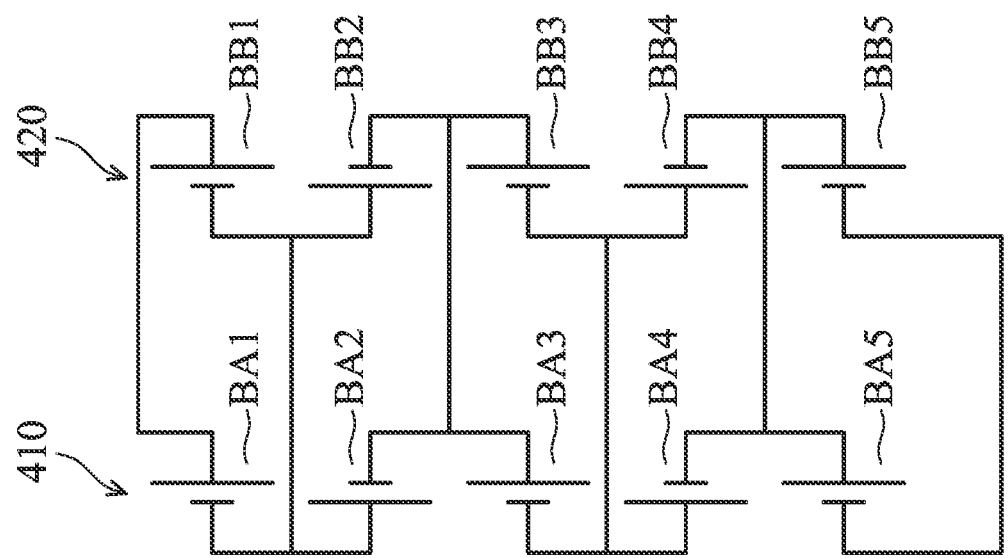
FIG. 4B is a schematic diagram of an exemplary embodiment of the battery string shown in FIG. 4A according to various aspects of the present disclosure.

FIG. 4B is a schematic diagram of an exemplary embodiment of the battery strings 410 and 420 shown in FIG. 4A according to various aspects of the present disclosure. As shown in FIG. 4B, the battery string 410 is connected to the battery string 420 in parallel. In this embodiment, the battery BA1 is connected to the battery BB1 in parallel, the battery BA2 is connected to the battery BB2 in parallel, the battery BA3 is connected to the battery BB3 in parallel, the battery BA4 is connected to the battery BB4 in parallel, and the battery BA5 is connected to the battery BB5 in parallel. The connection method between the battery strings 410 and 420 is not limited in the present disclosure. In other embodiments, the battery string 410 may connect to the battery string 420 in series. In this embodiment, the number of batteries of the battery string 410 is the same as the number of batteries of the battery string 420, but the disclosure is not limited thereto. In other embodiments, the number of batteries of the battery string 410 may be different from the number of batteries of the battery string 420.

Figure 5:
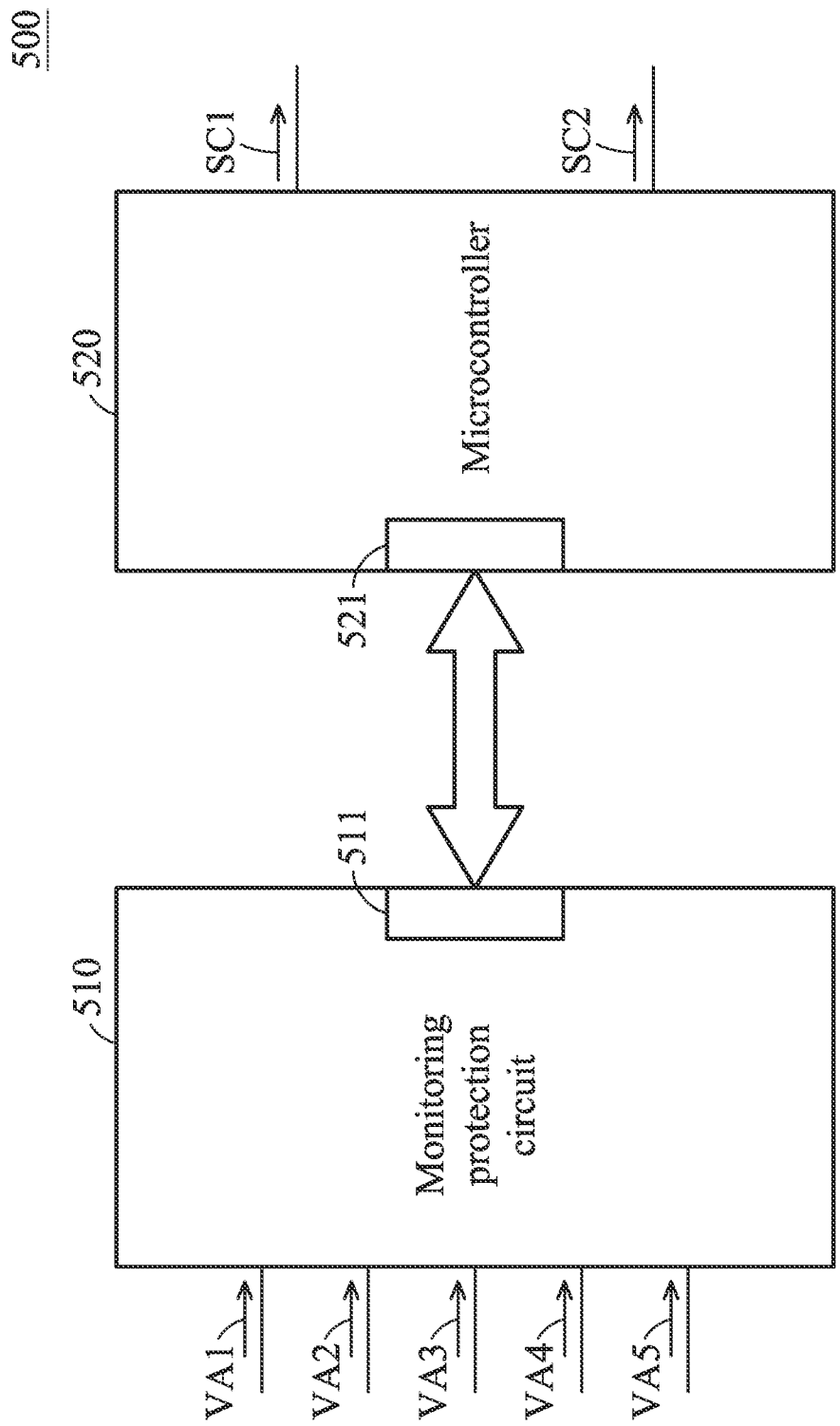
FIG. 5 is a schematic diagram of an exemplary embodiment of a control circuit according to various aspects of the present disclosure.

FIG. 5 is a schematic diagram of an exemplary embodiment of a control circuit according to various aspects of the present disclosure. The control circuit 500 comprises a monitoring protection circuit 510 and a microcontroller 520. To clarity, FIG. 2 is given as an example. The monitoring protection circuit 510 detects the voltages VA1~VA5 of the batteries BA1~BA5. In this embodiment, the monitoring protection circuit 510 comprises a communication interface 511. The communication interface 511 is configured to output the voltages VA1~VA5. The structure of the monitoring protection circuit 510 is not limited in the present disclosure. In one embodiment, the monitoring protection circuit 510 comprises a voltage detection circuit (not shown). In another embodiment, the monitoring protection circuit 510 further comprises a temperature detection circuit (not shown) to detect the temperatures of the batteries BA1~BA5. In other embodiments, the monitoring protection circuit 510 further comprises a current detection circuit (not shown) to detect the discharge currents of the batteries BA1~BA5.

The microcontroller 520 determines whether the voltage difference between the maximum voltage and the minimum voltage among voltages VA1~VA5 exceeds the threshold value. In this case, the microcontroller 520 comprises a communication interface 521. The communication interface 521 is configured to receive voltages VA1~VA5. When the voltage difference between the maximum voltage and the minimum voltage among voltages VA1~VA5 does not exceed the threshold value, the microcontroller 520 does not enable the control signals SC1 and SC2. Therefore, the switches 220 and 240 are turned off. However, when the voltage difference between the maximum voltage and the minimum voltage among voltages VA1~VA5 exceeds the threshold value, the microcontroller 520 enables the control signal SC1 or SC2 to turn on switch 220 or switch 240.

For example, when the voltage difference between the maximum voltage and the minimum voltage among voltages VA1~VA5 exceeds the threshold value and the voltage VA4 is the minimum voltage, the microcontroller 520 enables the control signal SC1. Therefore, the switch 220 is turned on to increase the conductivity of the metal plate 213. However, when the voltage difference between the maximum voltage and the minimum voltage among voltages VA1~VA5 exceeds the threshold value and voltage VA5 is the minimum voltage, the microcontroller 520 enables the control signal SC2. At this time, the switch 240 is turned on to increase the conductivity of the metal plate 214.

In other embodiments, the microcontroller 520 has a low-voltage protection function. Taking FIG. 3 as an example, when one of voltages VA1~VA5 is too low, the microcontroller in the control circuit 330 outputs a switching signal (not shown) to cut off the path (not shown) between the battery string 310 and the load, which directs the batteries BA1~BA5 to stop discharging. However, when the size of at least one of metal plates 311314 is too small, the small size may cause the corresponding battery (e.g., BA4) to over-discharge. Therefore, the low-voltage protection function of the microcontroller is triggered. To avoid triggering the low-voltage protection function, the control circuit 330 determines whether the voltage difference between the maximum voltage and the minimum voltage among voltages VA1~VA5 exceeds the threshold value. When the voltage difference between the maximum voltage and the minimum voltage among voltages VA1~VA5 exceeds the threshold value, the control circuit 330 turns on the switch (e.g., 350) which is coupled to the battery (e.g., BA4) having the minimum voltage. Therefore, the conductivity of the metal plate (e.g., 313) which is connected to the positive terminal of the battery (e.g., BA4) having the minimum voltage is increased to reduce the drop speed of the minimum voltage. In one embodiment, when the switch 350 is turned on, the voltage VA4 is increased slightly.

Figure 6:
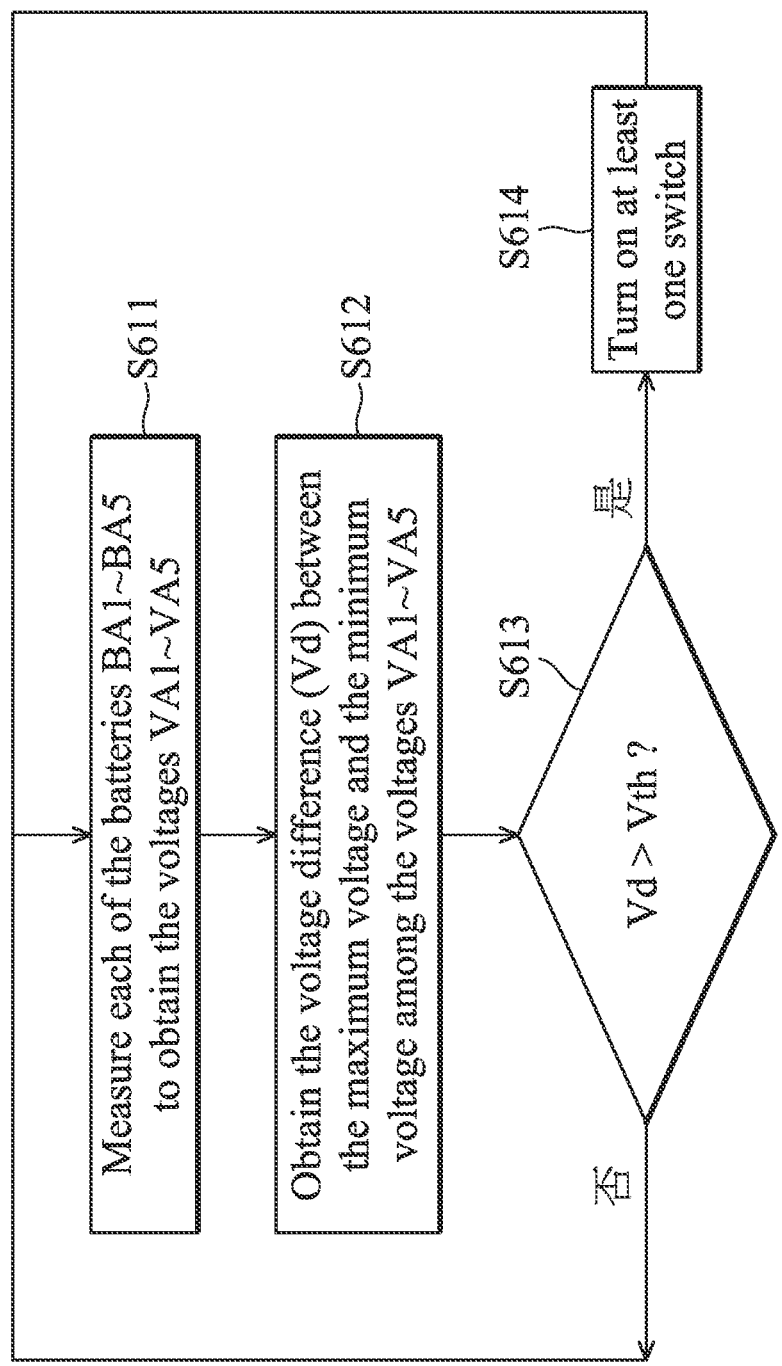
FIG. 6 is a flowchart of an exemplary embodiment of a control method according to various aspects of the present disclosure.

FIG. 6 is a flowchart of an exemplary embodiment of a control method according to various aspects of the present disclosure. The control method can be applied in the control circuit 130 of FIG. 1, the control circuit 230 of FIG. 2, or the control circuit 330 of FIG. 3. To clarity, FIG. 1 is given as an example. First, each of the batteries BA1~BA5 is measured to obtain the voltages VA1~VA5 of the batteries BA1~BA5 (step S611). In one embodiment, the control circuit 130 has a monitoring protection circuit to detect the voltages VA1~VA5.

Next, the voltage difference between the maximum voltage and the minimum voltage among the voltages VA1~VA5 is obtained (step S612). In one embodiment, the control circuit 130 has a microcontroller to calculate a voltage difference (Vd) between a maximum voltage and a minimum voltage among the voltages VA1~VA5.

A determination is made as to whether the voltage difference (Vd) exceeds the threshold value (step S613). In one embodiment, the microcontroller in the control circuit 130 determines whether the voltage difference (Vd) exceeds the threshold value (Vth). When the voltage difference (Vd) does not exceed the threshold value (Vth), step S611 is performed to measure voltages VA1~VA5 of batteries BA1~BA5. However, when the voltage difference (Vd) exceeds the threshold value (Vth), at least one switch is turned on (step S614). In FIG. 1, the control circuit 130 enables the control signal SC to turn on the switch 120 so that the input terminal 121 of the switch 120 is electrically connected to the output terminal 122. In other embodiments, the control circuit turns on the switch which is connected to the positive terminal of the battery that has the minimum voltage. Taking FIG. 3 as an example, when the voltage VA2 of battery BA2 is the minimum voltage, the control circuit 330 turns on the switch 320. Similarly, when the voltage VA3 of battery BA3 is the minimum voltage, the control circuit 330 turns on the switch 340.

When the switch connected to a corresponding metal plate is turned on, a turned-on path is added in the corresponding metal plate. This means that the size of the corresponding metal plate is increased so that the equivalent impedance of the corresponding metal plate is reduced. Therefore, the voltage drop of the battery connected to the corresponding metal plate becomes too small to ensure that the battery will discharge.

Control methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes a control circuit for practicing the methods. The control methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes a control circuit for practicing the disclosed methods. When implemented on a general-purpose processor, the program code combines with the processor to provide a unique apparatus that operates analogously to application-specific logic circuits.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A battery module comprising:
   a first battery string comprising:
   a first battery comprising a first positive terminal and a first negative terminal;
   a second battery comprising a second positive terminal and a second negative terminal;
   a third battery comprising a third positive terminal and a third negative terminal;
   a first metal plate connected to the first negative terminal and the second positive terminal;
   a second metal plate connected to the second negative terminal and the third positive terminal;
   a first switch comprising a first input terminal and a first output terminal, wherein the first input terminal and the first output terminal are directly connected to the first metal plate; and
   a second switch comprising a second input terminal and a second output terminal, wherein the second input terminal and the second output terminal are directly connected to the second metal plate;
   wherein when the first switch is turned on, the first input terminal is connected to the first output terminal to generate a first turned-on path in the first metal plate and to cause an equivalent impedance of the first metal plate to decrease, and when the second switch is turned on, the second input terminal is connected to the second output terminal to generate a second turned-on path in the second metal plate and to cause an equivalent impedance of the second metal plate to decrease.

2. The battery module as claimed in claim 1, wherein a size of the first metal plate is smaller than a size of the second metal plate.

3. The battery module as claimed in claim 1, further comprising:
   a control circuit turning on at least one of the first switch and the second switch according to voltages of the first battery, the second battery, and the third battery.

4. The battery module as claimed in claim 3, wherein the control circuit comprises:
   a monitoring protection circuit detecting a voltage of the first battery to obtain a first voltage, detecting a voltage of the second battery to obtain a second voltage, and detecting a voltage of the third battery to obtain a third voltage; and
   a microcontroller determining a maximum voltage and a minimum voltage among the first, second, and third voltages, determining a voltage difference between the maximum voltage and the minimum voltage, and determining whether the voltage difference exceeds a threshold value,
   wherein in response to the voltage difference not exceeding the threshold value, the microcontroller does not turn on the first switch and the second switch.

5. The battery module as claimed in claim 4, wherein in response to the voltage difference exceeding the threshold value, the microcontroller turns on one of the first switch and the second switch.

6. The battery module as claimed in claim 5, wherein:
   in response to the voltage difference exceeding the threshold value and the second voltage being the minimum voltage, the microcontroller turns on the first switch, and
   in response to the voltage difference exceeding the threshold value and the third voltage being the minimum voltage, the microcontroller turns on the second switch.

7. The battery module as claimed in claim 6, wherein the first switch further comprises a first control terminal to receive a first control signal, the second switch further comprises a second control terminal to receive a second control signal, and the microcontroller enables one of the first control signal and the second control signal according to the first voltage, the second voltage, and the third voltage.

8. The battery module as claimed in claim 7, wherein:
   in response to the voltage difference exceeding the threshold value and the second voltage being the minimum voltage, the microcontroller enables the first control signal to turn on the first switch; and
   in response to the voltage difference exceeding the threshold value and the third voltage being the minimum voltage, the microcontroller enables the second control signal to turn on the second switch.

9. The battery module as claimed in claim 1, further comprising:
   a second battery string comprising:
   a fourth battery comprising a fourth positive terminal and a fourth negative terminal;
   a fifth battery comprising a fifth positive terminal and a fifth negative terminal; and
   a third metal plate connected to the first metal plate, the fourth negative terminal, and the fifth positive terminal; and
   a third switch comprising a third input terminal and a third output terminal, wherein the third input terminal and the third output terminal are connected to the third metal plate.

* * * * *